United States Patent [19]
Netis et al.

[11] Patent Number: 6,115,310
[45] Date of Patent: Sep. 5, 2000

[54] WORDLINE ACTIVATION DELAY MONITOR USING SAMPLE WORDLINE LOCATED IN DATA-STORING ARRAY

[75] Inventors: Dmitry G. Netis, Beacon; L. Brian Ji, Fishkill; Toshiaki Kirihata, Poughkeepsie, all of N.Y.

[73] Assignee: International Business Machines Corporation, Armonk, N.Y.

[21] Appl. No.: 09/225,343

[22] Filed: Jan. 5, 1999

[51] Int. Cl.[7] .................................................. G11C 7/02
[52] U.S. Cl. ........................... 365/210; 365/200; 365/63; 327/293; 327/297
[58] Field of Search ................ 365/210, 51, 63, 365/200, 230.04, 230.06; 327/293, 297

[56] References Cited

U.S. PATENT DOCUMENTS

| | | | |
|---|---|---|---|
| 4,687,951 | 8/1987 | McElroy ................................. | 307/269 |
| 4,839,860 | 6/1989 | Shinoda et al. ........................ | 365/104 |
| 4,922,128 | 5/1990 | Dhong et al. .......................... | 307/269 |
| 5,010,524 | 4/1991 | Fifield et al. .......................... | 365/205 |
| 5,031,153 | 7/1991 | Suyama ................................. | 365/206 |
| 5,124,951 | 6/1992 | Slemmer et al. ................... | 365/230.06 |
| 5,282,267 | 1/1994 | Woo, Jr. et al. ....................... | 395/157 |
| 5,579,266 | 11/1996 | Tahara .................................. | 365/200 |
| 5,592,428 | 1/1997 | Harrand et al. ....................... | 365/210 |
| 5,652,729 | 7/1997 | Iwata et al. ........................... | 365/222 |
| 5,654,918 | 8/1997 | Hammick ............................ | 365/185.2 |
| 5,691,946 | 11/1997 | DeBrosse et al. .................... | 365/200 |
| 5,796,284 | 8/1998 | Clemen et al. ........................ | 327/264 |

OTHER PUBLICATIONS

W. Cordaro, et al., "Sense Latch Triggering Circuit", IBM Technical Disclosure Bulletin, vol. 26, No. 10B, Mar. 1984.

"Fast DRAM Sensing With Sense Amplifiers Synchronous to Bitline Delays", IBM Technical Disclosure Bulletin, vol. 29, No. 10, Mar. 1987.

Kirihata, et al., "A 14–ns 4–Mb CMOS DRAM with 300–mW Active Power", IEEE Journal of Solid–State Circuits, vol. 27, No. 9, Sep. 1992.

C–C. Lu, et al., "A 22–ns 1–Mbit CMOS High–Speed DRAM with Address Multiplexing", IEEE Journal of Solid–State Circuits, vol. 24, No. 5, Oct. 1989.

*Primary Examiner*—Son Mai
*Attorney, Agent, or Firm*—Daryl K. Neff

[57] ABSTRACT

A wordline activation delay monitor circuit is disclosed herein which includes a sample wordline located within a data-storing array of a memory, wherein the sample wordline is selected or activated by circuitry having substantially the same structure or location within the memory as circuitry which selects or activates wordlines of the data-storing array. A circuit is disclosed which determines a wordline activation delay for a first subarray group within the memory by activating a sample wordline which is located within a data-storing array of a second subarray group. Corresponding methods are also disclosed.

19 Claims, 7 Drawing Sheets

MULTI-BANK MEMORY

MULTI-BANK MEMORY

WORDLINE ACTIVATION DELAY MONITOR USING SAMPLE WORDLINE LOCATED IN DATA-STORING ARRAY

RELATED APPLICATION

This application is related to U.S. Pat. application Ser. No. 09/225,340, filed on even date herewith entitled "A Robust Wordline Activation Delay Monitor Using a Plurality Of Sample Wordlines" (Attorney Docket No. FI9-98-200).

FIELD OF THE INVENTION

This invention relates to circuitry for control of operations within a semiconductor memory and more specifically to a circuit for use in estimating a delay associated with activation of a wordline within a semiconductor memory.

BACKGROUND OF THE INVENTION

In a semiconductor memory such as a dynamic random access memory (DRAM) IC, the time it takes to activate a wordline over its entire length is one of the most significant contributors to the total (off-chip) access time. The wordline activation delay is influenced by several parameters including the length and width of the wordline, the number of devices accessed thereby, and the thickness of the device gate oxide. Longer, narrower wordlines take longer to fully activate because of the greater RC time constant associated therewith.

As devices become ever more densely packed in memory ICs, longer, proportionally narrower wordlines will be required to serve even greater numbers of devices. Consequently, the wordline activation delay will become an even greater contributor to the total off-chip access time.

In an effort to decrease the off-chip access time, various schemes have been used to more accurately estimate the delay in activating a wordline. Simplified for functional purposes, the wordline activation delay is modeled as the amount of time required for 1) row predecoded address signals to propagate through the spine of a dual memory unit; and then 2) be decoded so as to activate the selected wordline driver (at which time the voltage is raised on the wordline); and then 3) for the raised voltage to propagate to the selected column location (at which time complementary signals develop on the selected bitline pair which can be latched by a sense amplifier). Thus, the wordline activation delay is modeled as the total amount of delay between the presentation of row predecoded address signals in the spine to the development of the complementary bitline voltages upon accessing the selected memory cell.

Various schemes have been used or proposed to estimate the wordline activation delay. Hardwired random wordline delay monitors have been utilized to monitor the particular delay in activating each distinct wordline in the memory array.

An example of a prior art sample wordline delay monitor (SWLM) will now be described with reference to FIG. 1. In the prior art example shown in FIG. 1, the sample wordline 202 is located in a separate sample wordline array (SWLA) 200 which is not closely associated with any array 210 in which actual data is stored (arrays 210 are hereinafter referred to as "data-storing arrays"). The data-storing arrays 210 and the row decoder and wordline driver 220 are not part of the circuit which estimates the sample wordline activation delay.

The wordline activation delay is estimated by raising the voltage at a first end 204 of a sample wordline 202, waiting for the raised voltage to propagate the length of the sample wordline, and then triggering a sense amplifier enable (SAE) signal at a fixed delayed interval after the raised voltage reaches a second end 206 of the sample wordline. Since the data-storing arrays 210 and the row decoder and wordline driver circuitry 220 form no part of the sample wordline delay monitor circuit, considerable imprecision results. In order to assure that sense amplifiers are enabled only after the selected wordline is fully activated, the prior art sample wordline delay monitor must accommodate the maximum wordline delay which might occur within any data-storing array 210, as calculated when plans for the IC memory are under design, the delay in propagation of signals through the row decoder and wordline driver 220, plus an additional interval to allow for variations in the manufacturing process or in operating conditions. To factor in such delays and potential variations in delay, the prior art sample wordline delay monitor includes a delay line 230 which subjects the SAE signal to a large fixed delay.

Due to variability in the manufacturing process and in device parameters which occur over different portions of the IC, the activation delay of a sample wordline in such scheme might not accurately reflect the worst case activation delay, especially when the selected wordline and the sample wordline lie at very different physical locations far from each other. Moreover, the decoding scheme used to activate the sample wordline delay monitor may vary significantly from that used to activate the selected wordline. Therefore, in such existing sample wordline monitoring circuits, the estimated activation delay has been associated with a wide margin of error.

Accordingly, an object of the invention is to provide a sample wordline delay monitor which more accurately reflects an actual delay in activating a wordline within a semiconductor memory.

Another object of the invention is to provide a sample wordline delay monitor which utilizes decoding circuitry which more closely matches that of the particular selected wordline which is activated.

Still another object of the invention is to provide a sample wordline delay monitor which monitors an activation delay on a sample wordline which is located within the same bank of a multiple bank semiconductor memory.

A further object of the invention is to provide a sample wordline delay monitor which monitors an activation delay on a sample wordline which is located within a paused subarray of a memory bank wherein a selected wordline is activated in another subarray of the same bank.

Another object of the invention is to provide a robust sample wordline delay monitor which incorporates a sample wordline redundancy which, in case of malfunction in a sample wordline monitoring path, can be used in place of the sample wordline.

Still another object of the invention is to provide an arrangement of interleaved sample wordlines which are each used on alternate successive memory accesses to the same memory bank to reduce stress and extend the life of individual sample wordlines.

SUMMARY OF THE INVENTION

These and other objects are provided by the wordline activation delay monitor circuit of the present invention. According to a first embodiment of the invention, the delay monitor circuit includes a sample wordline located within a data-storing array of said memory, wherein the sample wordline is selected or activated by circuitry having substantially the same structure or location within the memory as circuitry which selects or activates wordlines of the data-storing array.

Preferably, the delay monitor circuit is located along a peripheral edge of the data-storing array. The sample wordline may include a pair of dummy wordlines of the data-storing array which are joined together at a location at or past their midpoint.

In a preferred embodiment, the delay monitor circuit also includes a sample wordline redundancy which is selected or activated by the same circuitry which selects or activates the sample wordline. Preferably, the circuitry includes a decoder circuit which is coupled to receive nonvolatile input and a wordline driver circuit coupled to activate either of the sample wordline or the sample wordline redundancy based on output from the decoder circuit.

In another preferred embodiment, the delay monitor circuit includes at least two sample wordlines which are located within a first data-storing array wherein the sample wordlines are activated alternately during successive accesses to the memory.

Still more preferably, sample wordlines in a first data-storing array are activated alternately during successive accesses to a second data-storing array in a bank which includes the first and the second data-storing arrays.

In another embodiment of the invention, a wordline activation delay monitor circuit is provided which includes at least one sample wordline located within a data-storing subarray of a first subarray group of a memory; at least one second sample wordline located within a data-storing subarray of a second subarray group of the memory; and a sample wordline selector circuit coupled to activate the first sample wordline when a data location within the second subarray group is to be accessed and to activate the second sample wordline when a data location within the first subarray group is to be accessed.

In another embodiment of the invention, a method of determining a wordline activation delay in a semiconductor memory is provided which includes the steps of: activating a sample wordline located in a data-storing array of the memory using at least one of a row decoder circuit or wordline driver circuit which has substantially the same structure as that used to activate wordlines within the data-storing array; and determining the activation delay from a delay in propagation of an activation voltage along the sample wordline.

In yet another method embodiment of the invention, a method of determining a wordline activation delay in a semiconductor memory is provided which includes the steps of: providing a memory bank having a plurality of data-storing subarrays within the semiconductor memory wherein subarrays are arranged in first and second groups each having at least one subarray; providing a sample wordline within a data-storing subarray of the first and second groups; at a time when a data location of a subarray within a said first group is to be accessed, changing a wordline voltage of the sample wordline at a first location thereof to activate the sample wordline in a subarray of the second group; and determining an activation delay from a detected voltage at a second location of the first sample wordline.

DETAILED DESCRIPTION OF THE PREFERRED EMBODIMENTS

I. SAMPLE WORDLINE DELAY MONITORING IN PAUSED OPERATIONAL SUBARRAY

Figure 1:
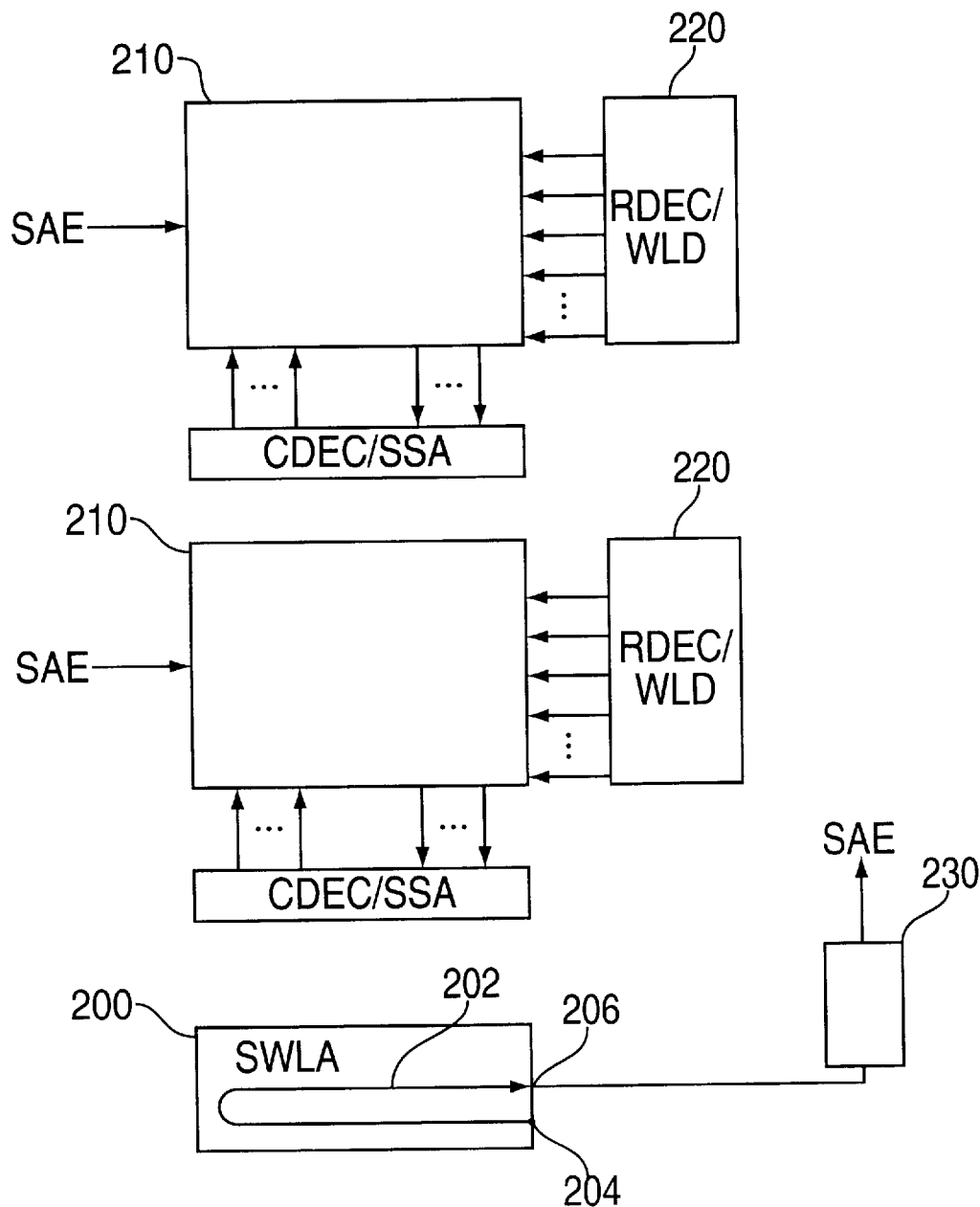
FIG. 1 is a block and schematic diagram showing a prior art example of an organization for a memory in which an separate array is set aside for a sample wordline.
Figure 2:
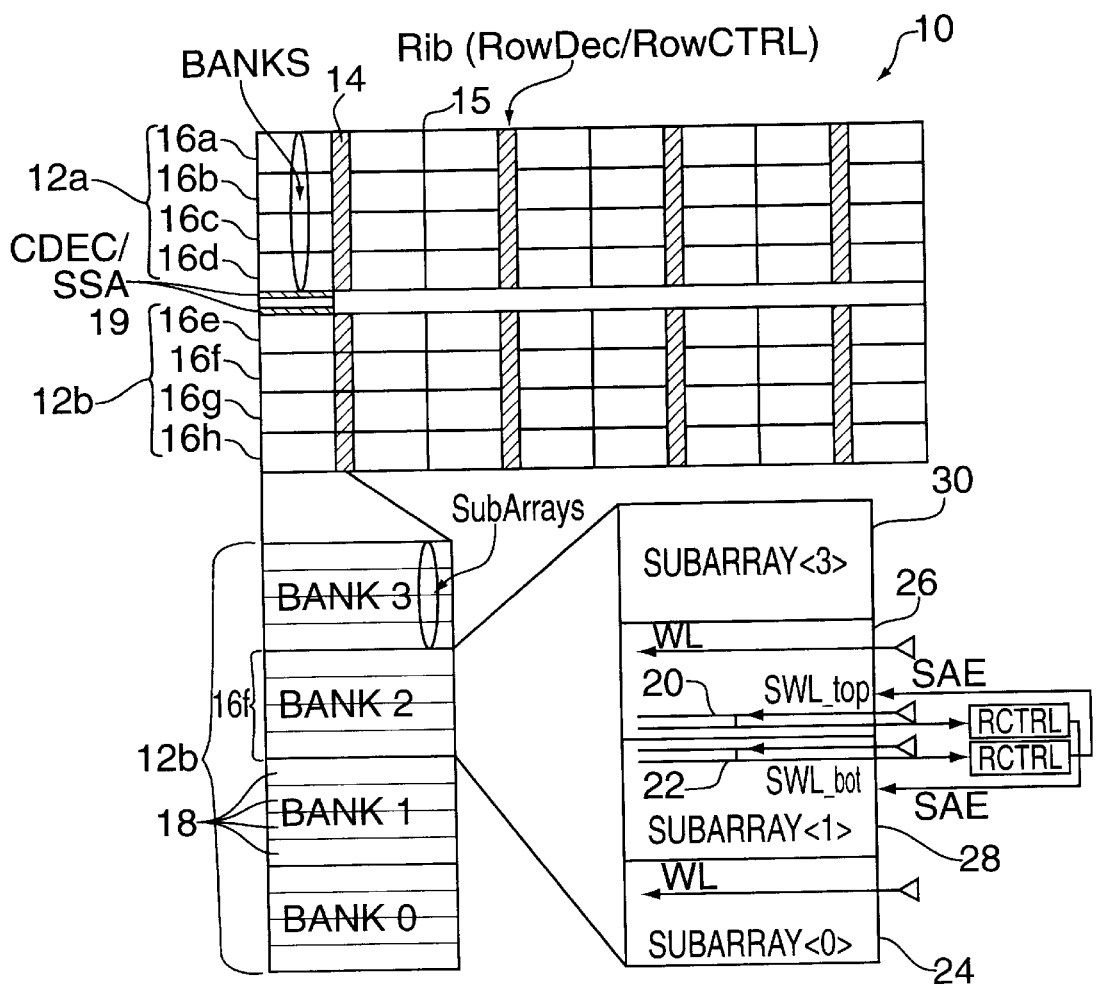
FIG. 2 is a block and schematic diagram showing a multiple bank memory such as a dynamic random access memory (DRAM) and the placement of sample wordlines therein according to the present invention.

FIG. 2 is a block and schematic diagram showing a multiple bank memory, e.g. a dynamic random access memory (DRAM), and the relationship of a first embodiment of the invention thereto. As shown in FIG. 2, a multiple bank memory 10 such as a DRAM contains a plurality of memory units 12. Herein, a memory unit 12 is defined as a region of memory including a memory array which has column decoder and sense amplifier circuitry 19 dedicated thereto, located typically on one end of the unit, and which is accessed by one set of row decoder and row control circuitry in a rib 14 of the memory 10. The second sense amplifiers (block 19) transfer data to and from first sense amplifiers located in the interior of memory unit 12.

Within each memory unit 12 an array region is provided which includes a plurality of banks. In FIG. 2 a first unit 12 includes four banks 16a, 16b, 16c, 16d, and a second unit 12 includes the four banks 16e, 16f, 16g, 16h. A bank is defined as a region of memory which provides access, on a single store or fetch operation, to a data word of the full length, e.g. eight bits, which is defined for the IC. Each bank, e.g. bank 16f, includes a plurality of subarrays 18. A subarray 18 is defined as the array region of a bank which is separated from other subarrays by, and is supported by first sense amplifiers (not shown) which are located along the boundary between subarrays 18. In a bank 16 having four subarrays 18, as shown in FIG. 2, one or more subarrays 18 may be accessed at times at which other subarrays 18 of the same bank remain paused, i.e. not accessed. In the exemplary embodiment described herein, a bank 16 includes a pair of even subarrays numbered <0> and <2>, and a pair of odd subarrays numbered <1> and <3>. When a bank 16 is accessed, four storage locations in each of two subarrays, for example, the even subarrays <0> and <2> are accessed simultaneously to provide access to an eight bit data word. At that time, the odd subarrays <1> and <3> are paused. On a subsequent memory access, the odd subarrays <1> and <3> can be accessed while the even subarrays <0> and <2> are paused.

Figure 3:
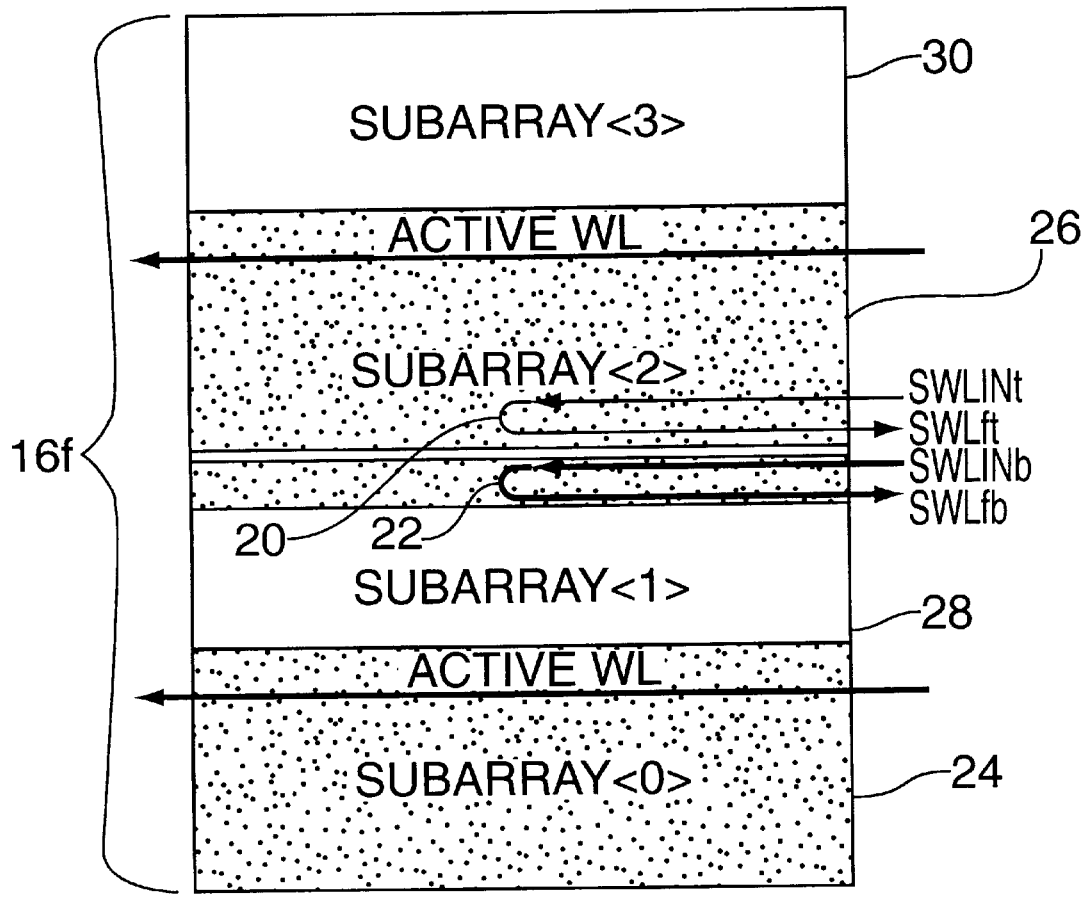
FIG. 3 is a block diagram illustrating the activation of sample wordlines within a paused subarray of a bank within a memory according to the present invention.

With reference to FIG. 3, an exemplary bank 16f includes four subarrays 18 numbered <0> through <3>. Within bank 16f sample wordlines 20, 22 are provided which are physically located within the memory array, preferably at the outer edge thereof, to provide wiring access thereto by specialized signal lines. In the arrangement shown in FIG. 3, bank 16 is designed so as to permit simultaneous access to locations only within particular activated subarrays 24, 26. At such time as subarrays 24, 26 are activated, subarrays 28, 30 remain paused and do not provide access to memory locations therein. It will be understood that a memory can be designed to have any one of a variety of active and inactive subarray groupings within a bank. For example, a bank can be designed to have two subarrays, with one subarray being active and the other being paused at each particular time. Another possibility could be for the bank to have four subarrays with each subarray capable of being activated independently from the other three which would remain paused. Still another exemplary possibility would be one in which the bank has eight subarrays, wherein groups of each two subarrays are accessed independently from the three remaining groups.

Figure 4:
FIG. 4 is a block and schematic diagram illustrating a preferred circuit for generating a sense amplifier enable (SAE) signal from outputs of sample wordlines arranged according to the present invention.

As shown in FIG. 3, a sample wordline SWL__top 20 is placed in subarray 26 to be activated when subarrays 24, 26 are paused. Another sample wordline SWL__bottom 22 is placed in subarray 28 to be activated when subarrays 28, 20 are paused. Sample wordline 20 is activated through an input end SWLINt and coupled to monitoring circuitry on an output end SWLft; similarly, sample wordline 22 is activated through an input end SWLINb and coupled to monitoring circuitry on an output end SWLfb. The outputs SWLft and SWLfb are input to a sense amplifier enable (SAE) signal generator circuit, as shown in FIG. 4, which outputs the SAE signal to sense amplifiers after detecting the wordline activation voltage at the output of either sample wordline (SWLft or SWLfb).

Figure 6:
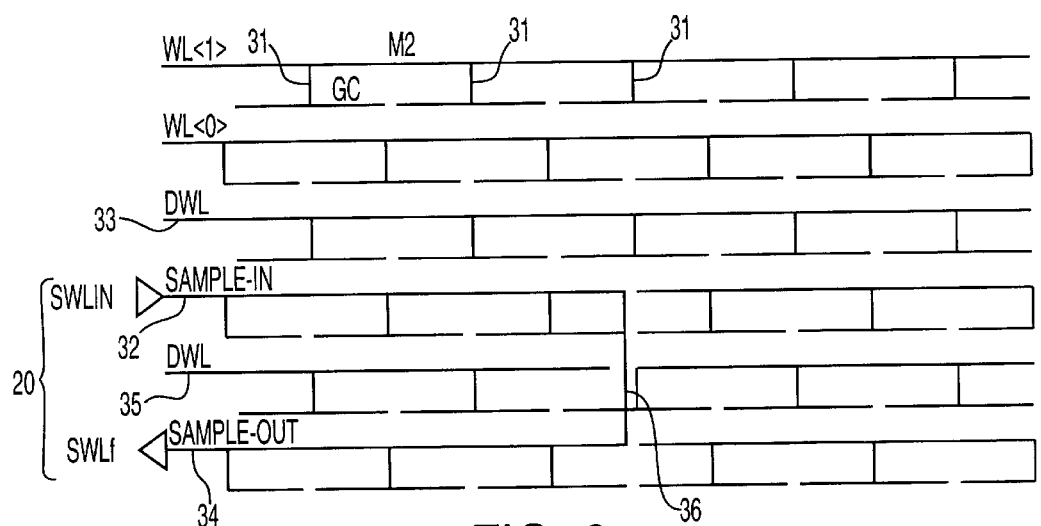
FIG. 6 is layout diagram showing a preferred way of laying out a sample wordline in relation to wordlines and dummy wordlines of the memory subarray, according to an embodiment of the present invention.

In FIG. 6, in a preferred embodiment of a physical layout, wordlines WL<0> and WL<1> are constructed of metallization patterns M2 which are stitched by conductive vias 31 to gate conductor patterns GC in a memory array at appropriate intervals. A dummy wordline (DWL) is a gate conductor line which is patterned in a peripheral area of the memory to the exterior of the regular wordlines WL<0> and WL<1> for fill purposes. Preferably, a sample wordline is constructed of a first dummy wordline 32 which is coupled to a second dummy wordline 34 at a point at or past the respective midpoints of each dummy wordline. As shown in the exemplary embodiment in FIG. 6, the sample wordline is located in a peripheral area of the memory array to the exterior of the regular wordlines. However, such placement is made for the purpose of efficiently utilizing the array area by replacing dummy wordline patterns with sample wordlines. It will be understood that sample wordlines can be located at other locations not lying along the periphery of the data-storing memory array, and/or not only in locations where dummy wordlines are ordinarily located.

Figure 5:
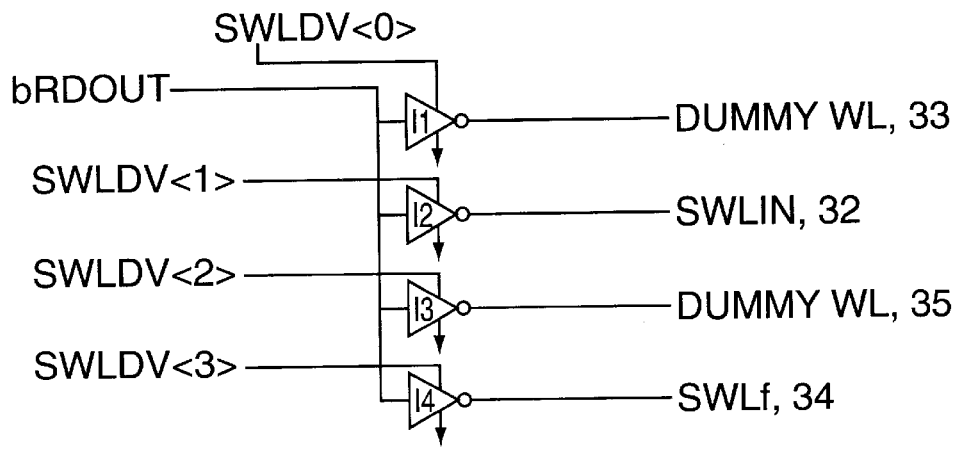
FIG. 5 is a block and schematic diagram showing a wordline driver circuit used to activate a sample wordline in an embodiment constructed according to the present invention.

Referring to FIG. 5, preferably a 1 out of 4 wordline driver circuit activates a sample wordline in accordance with the state of row decoder output bRDOUT and a selection input SWLDV<1>. Those skilled in the art will recognize the 1 out of 4 wordline driver circuit as being the same as that which selects and activates the regular wordlines in existing memory arrays. It will be understood the modifications which can be made in order to utilize 1 out of 2 or 1 out of 8 wordline decoding. In the circuit shown in FIG. 5, row decoder output is provided to the inputs of four inverters. Each of the four inverters is preferably physically positioned adjacent to wordline or dummy wordline patterns within the data-storing memory array as follows. A first inverter I1 is positioned adjacent to a first dummy wordline 33 which lies closest to the first wordline WL<0> of the array. A second inverter I2 is positioned adjacent to a Sample-In wordline (SWLIN) 32. Inverter I2 activates the sample wordline at location SWLIN 32. A third inverter is positioned adjacent to a second dummy wordline 35. Finally, a fourth inverter I4 is positioned adjacent to a Sample-Out wordline (SWLf) 34 which functions to propagate the wordline activation voltage signal back in the direction toward the wordline driver circuit, for further processing by a circuit such as shown in FIG. 4. Only the first Sample__In wordline 32 is activated by the wordline driver circuit. Activation is performed by presenting enabled row decoder output bRDOUT and enabled selection signal SWLDV<1> to the wordline driver, whereupon the wordline driver raises the voltage on the Sample__In wordline 32, preferably to the same voltage used to activate regular wordlines, e.g. WL<0> and WL<1>.

Operation of the first embodiment of the invention will now be described. Referring to FIG. 3, when a first group of subarrays 24, 26 within a bank 16f is accessed, a wordline is selected and activated (shown as "Active WL"; bold arrows) by row decoder and wordline driver circuits in each of the subarrays 24, 26. At the same time, another row decoder and wordline driver circuit (FIG. 5) activate a sample wordline 22 at a Sample-In position in the second group of subarrays 28, 30 which are paused at that time. Because the sample wordline 22 located in the same array patterned silicon region as the actual data-storing array; and is also activated by a row decoder and a wordline driver which are representative of those used for regular wordlines, the activation delay monitored on the sample wordline is highly representative of the actual wordline activation delay.

II. SAMPLE WORDLINE REDUNDANCY ARRANGEMENT

In a second main embodiment of the invention, an sample wordline redundancy is provided for replacing a regular sample wordline in case of malfunction during initial test.

Figure 7:
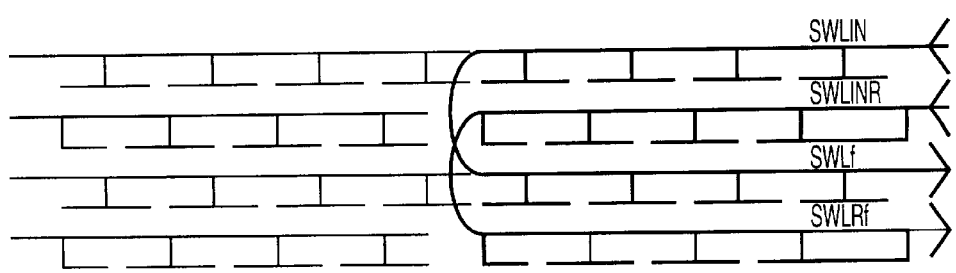
FIG. 7 is a layout diagram showing a preferred way of laying out a sample wordline and a sample wordline redundancy according to an embodiment of the present invention.
Figure 8:
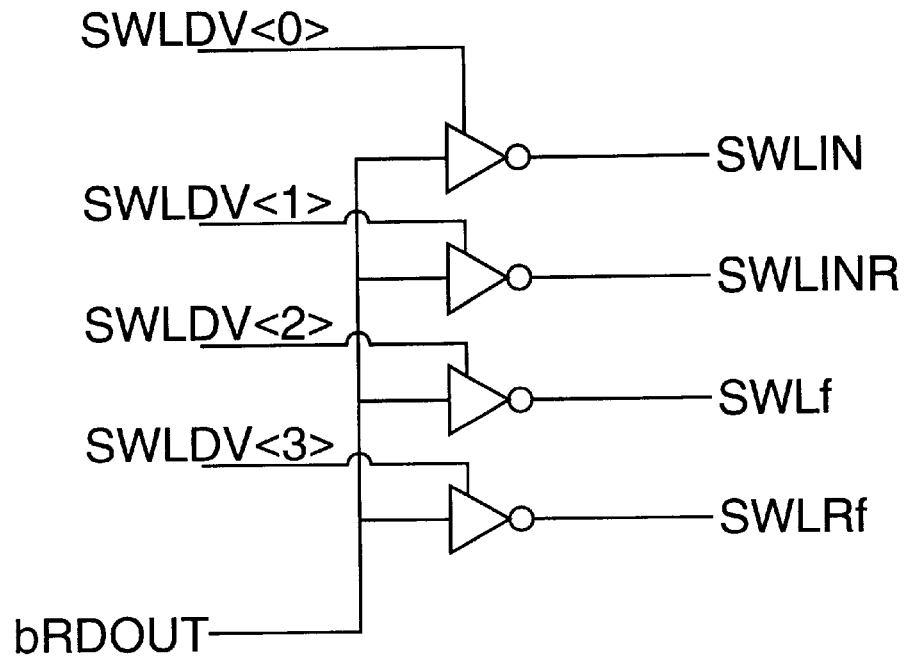
FIG. 8 is a block and schematic diagram showing a wordline driver circuit used to activate a sample wordline or a sample wordline redundancy in an embodiment constructed according to the present invention.

In a physical layout shown in FIG. 7, a sample wordline and a sample wordline redundancy are located within the area occupied by four GC line patterns and are preferably located in array area where dummy wordlines are ordinarily located at the periphery of a memory subarray. FIG. 8 is a block and schematic diagram of a one out of four wordline driver circuit used to activate a regular sample wordline through a SWLIN input, and to activate a sample wordline redundancy through a SWLINR input. Selection signals SWLDV<0> and SWLDV<1> select which one of the sample wordline or the sample wordline redundancy is activated when row decoder output bRDOUT is active.

Figure 9:
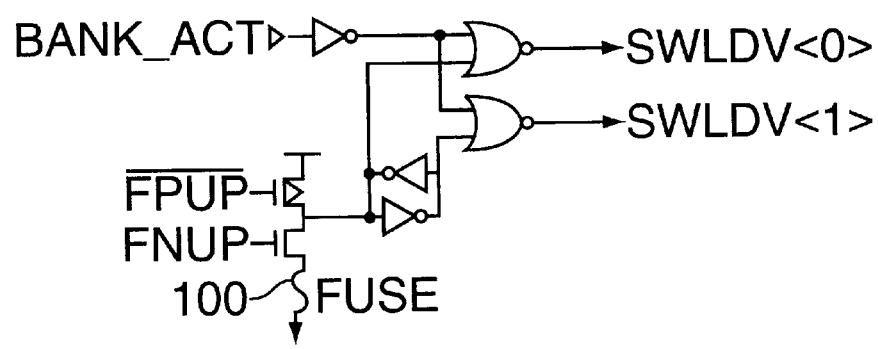
FIG. 9 shows a fuse-decoder circuit for selecting between a sample wordline or a sample wordline redundancy according to an embodiment of the invention.

In order to select between activating a sample wordline or the sample wordline redundancy, a fuse-decoder circuit is provided, which will now be described with reference to FIG. 9. Referring to FIG. 9, the fuse-decoder circuit outputs enables the selection signal SWLDV<0> and disables signal SWLDV<1> when the fuse conducts. Conversely, the fuse-decoder enables selection signal SWLDV<1> and disables signal SWLDV<0> when the fuse is blown.

Figure 10:
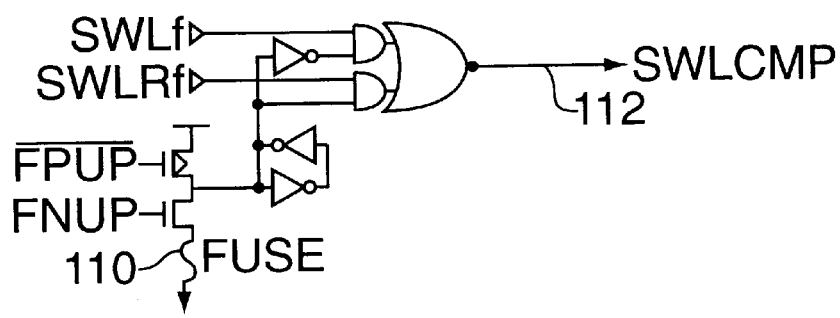
FIG. 10 shows a circuit for use in propagating a delay monitor output to a sense amplifier enable signal generator, from either an output of a sample wordline or an output of a sample wordline redundancy.

FIG. 10 shows a circuit for use in propagating either the output of a sample wordline SWLf or the output of a sample wordline redundancy SWLRf, depending upon the state of a fuse 110. The conducting or blown state of fuse 110 determines whether output of the sample wordline (SWLf) or output of the sample wordline redundancy (SWLRf) is gated through to a final output SWLCMP 112. The circuit shown in FIG. 10 is enabled by a change in signal level on SWLf when fuse 110 is conducting and by a change in signal level on SWLRf when fuse 110 is blown.

Figure 11:
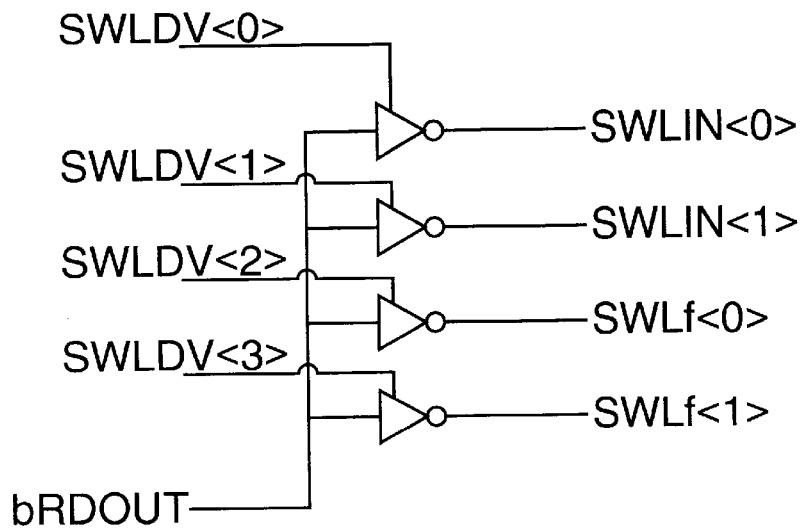
FIG. 11 is a block and schematic diagram showing a wordline driver circuit used to activate a first or a second sample wordline in an interleaved sample wordline embodiment constructed according to the present invention.

The output SWLCMP of the circuit shown in FIG. 11 is provided as input to a delaying circuit with latching (not shown) which generates a sense amplifier enable (SAE) signal. The sense amplifier enable (SAE) signal is delayed by a minimum interval of time in relation to the sample wordline output (SWLCMP) in order to assure that sense amplifiers are activated only after sufficient time has passed for the worst case wordline which is selectable within an active subarray of the bank to be fully activated.

The operation of the embodiment herein has already been described with respect to the fuse-decoder circuitry which determines which of the sample wordline or sample wordline redundancy are selected during normal operation. During normal memory operations, activation and monitoring of the sample wordline is as described in the foregoing part I with the exception that by blowing one or more fuses the sample wordline redundancy may be activated and monitored instead of the sample wordline.

III. INTERLEAVED SAMPLE WORDLINE DELAY MONITOR

In another embodiment of the invention, at least two sample wordlines are provided for each subarray of the memory, such that upon accessing the same subarray twice during successive RAS cycles each particular sample wordline is activated only once during each alternate row address strobe (RAS) cycle. Operation in this manner relieves stress on each sample wordline and extends the effective life of the memory by reducing the number of times that each sample wordline is accessed.

FIG. 11 is a schematic diagram showing a 1 out of 4 wordline driver circuit which is preferably used to activate a first sample wordline from a first input terminal SWLIN<0> and to activate a second sample wordline from a second input terminal SWLIN<1>. Those skilled in the art will understand the modifications which can be made for use of 1 out of 2 or 1 out of 8 wordline decoding. As described above with reference to FIG. 5, sample wordlines are preferably located at the outer periphery of the data-storing memory array, and more preferably where dummy wordlines are usually located at the extreme outer periphery of the data-storing array. In similar manner as described above with reference to FIG. 7, a first sample wordline SWLIN<0>, directly connected to wordline driver (FIG. 11), is coupled at a point past its mid-length to an output sample wordline which corresponds to location SWLf<0>. A second sample wordline SWLINc1>, directly connected to wordline driver (FIG. 11), is coupled at a point past its mid-length to an output sample wordline at location SWLf<1>. A first sample wordline is activated at SWLIN<0> by presenting active inputs at bRDOUT and SWLDV<0>. The second sample wordline is activated at SWLIN<1> by presenting active inputs at bRDOUT and SWLDV<1>. A row decoder produces the enabled output bRDOUT whenever either the first or second wordline is selected and activated within a particular subarray.

Figure 12:
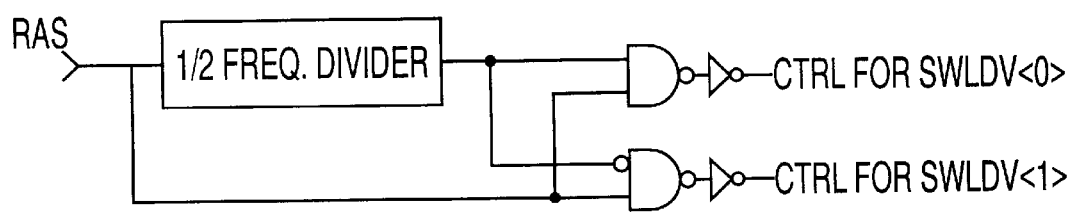
FIG. 12 shows a circuit used to select between providing an enabling input for a first sample wordline or for a second sample wordline in an interleaved sample wordline embodiment constructed according to the present invention.

FIG. 12 is a block and schematic diagram showing a circuit which enables a first sample wordline selection signal SWLDV<0> while disabling a second sample wordline selection signal SWLDV<1> during a first RAS cycle access to an active subarray of a bank. If during the next RAS cycle the same subarray is accessed, the circuit shown in FIG. 12 enables the second sample wordline selection signal SWLDV<1> while disabling the first sample wordline selection signal SWLDV<0>. Those skilled in the art will recognize many types of circuits which can be employed to produce toggled outputs on two lines in response to successive pulsed inputs, as is done here.

In a first RAS cycle access to an active subarray, the circuit shown in FIG. 12 produces an output which activates a relatively long duration selection signal at SWLDV<0>. When sample wordlines in a particular paused subarray are to be used, bRDOUT is activated, and the active bRDOUT and SWLDV<0> signals activate a first sample wordline at position SWLIN<0>. If the same active subarray is accessed on the next RAS cycle, the circuit shown in FIG. 12 enables activation of SWLDV<1> while disabling SWLDV<0>, such that the second sample wordline in the paused subarray is activated by the wordline driver circuit (FIG. 11) at position SWLIN<1>. Then, if the same active subarray is accessed yet another time in the following RAS cycle, the circuit shown in FIG. 12 enables activation of SWLDV<0> while disabling SWLDV<1>, and the first sample wordline in the paused subarray is again activated at position SWLIN<0>. In this manner, different sample wordlines are activated upon successive accesses to the same subarray which occur in successive RAS cycles.

It will be understood that the interleaved sample wordline delay monitor embodiment described in this part III can be used in combination with either or both of the first or second embodiments described in parts I and II above. For example, when the interleaved embodiment described herein is combined with the redundancy embodiment described in part II, two 1 out of 4 wordline driver circuits can be used which are of the same general type as shown and described above with reference to FIG. 8. In a first 1 out of 4 wordline driver circuit, first and second sample wordlines SWLIN<0> and SWLINR<0> will take the place of the signal lines SWLIN and SWLINR shown in FIG. 8. In a second 1 out of 4 wordline driver circuit, first and second sample wordline redundancies SWLIN<1> and SWLINR<1> will take the place of signal lines SWLIN and SWLINR shown in FIG. 8. Control over the activation of and monitoring of output of the regular and redundancy sample wordlines is managed by the same general circuits as shown in FIGS. 9 and 10.

Figure 13:
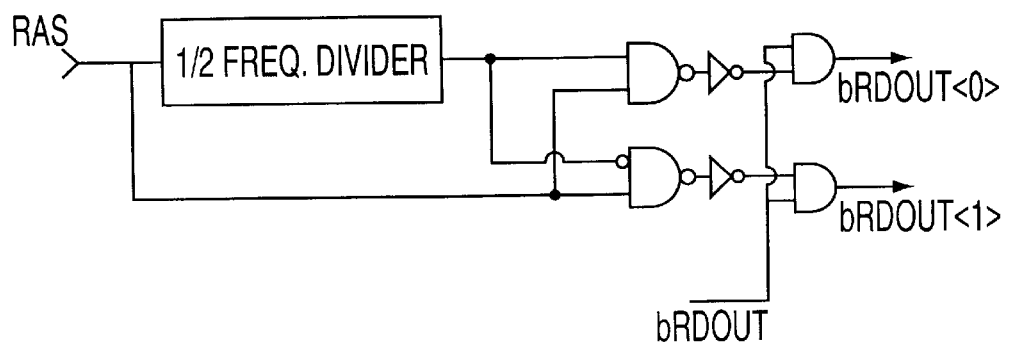
FIG. 13 shows a circuit used to select between providing an enabling input for a first wordline driver circuit or for a second wordline driver circuit in a combined embodiment constructed according to the present invention.

For this combined embodiment in which two 1 out of 4 wordline driver circuits are used, FIG. 13 shows a modified circuit of the same general type as that shown in FIG. 12 which can be used to toggle the activation of a first wordline driver circuit or the second wordline driver circuit when the same active subarray is accessed in successive RAS cycles. Referring to FIG. 13, bRDOUT is an enabled output of the row decoder. As will be understood, the circuit produces an enabled output bRDOUT<0> to the first wordline driver circuit in a first RAS cycle and produces an enabled output bRDOUT<1> to the second wordline driver circuit if the same subarray is accessed during the next RAS cycle.

Figure 14:
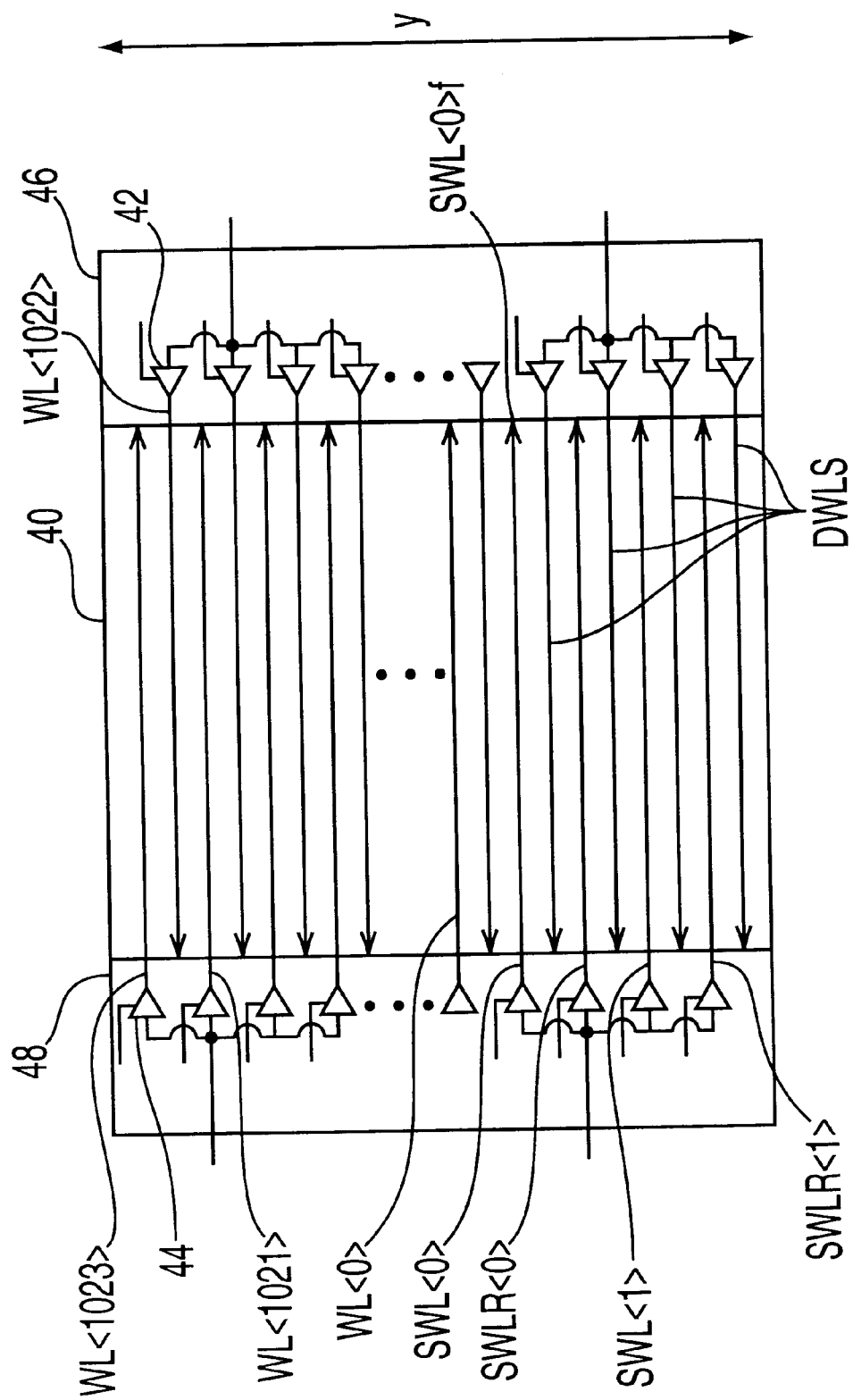
FIG. 14 is a block and schematic diagram showing an embodiment of the invention implemented in a two-sided wordline driver arrangement.

For any or all of the afore-described embodiments, the invention can be implemented in semiconductor memories which have a two-sided wordline driver organization. Referring to FIG. 14, in such two-sided organization, wordline drivers are placed on opposite sides 46, 48 of a memory array 40. Wordline drivers located on opposite sides 46, 48 are coupled to the wordlines WL<0> . . . WL <1023> in interleaved fashion such that adjacent wordlines, e.g. WL<1022> and WL<1023>, are driven by wordline drivers, e.g. drivers 42 and 43, respectively, which are located on opposite sides 46, 48. Such two-sided organization permits half as many wordline drivers to be placed on a side 46 or 48 within a given dimension y of an array 40 and therefore permits the pitch of wordline drivers located on each side to be relaxed.

An embodiment of the invention implemented in such two-sided organization will now be described. On left side 48 wordline drivers are shown arranged according to a one out of four decoding scheme. Those skilled in the art will understood the modifications necessary to realize the invention in other arrangements such as one out of two or a one out of eight arrangement. Wordline drivers on side 48 are coupled to sample wordlines SWL<0> and SWL<1> and sample wordline redundancies SWLR<0> and SWLR<1>. Activation of the sample wordlines or sample wordline redundancies is detected at side 46 at output ends thereof. For example, the activation of sample wordline SWL<0> is detected by circuitry (not shown) which is coupled to the sample wordline at end SWL<0>f.

In the afore-described embodiments, as described with reference to FIG. 6 (See SWLIN 32 joined to SWLf 34), sample wordlines were formed by joining two wordlines together, because the actual wordlines of the array terminated at a location 15 (FIG. 2) inside an array where it was not possible to place circuitry for detecting their activation. In this embodiment, since the activation of the sample wordline can be detected at an end 46 opposite an input end 48, the need to form sample wordlines by joining two wordlines together is eliminated. As a result, area savings can be realized. In addition, as shown in FIG. 14, sample wordlines which extend the same length as actual wordlines and which traverse the full width of the array may produce delays which are more representative of actual wordline delays.

While the invention has been described with respect to certain preferred embodiments thereof, those skilled in the art will recognize the many modifications and enhancements which can be made without departing from the true scope and spirit of the appended claims.

What is claimed is:

1. A wordline activation delay monitor circuit for a semiconductor memory comprising at least one sample wordline located within a data-storing array which includes memory cells accessible through wordlines and bitlines, said sample wordline being selected or activated by circuitry having substantially the same structure or location within said memory as circuitry which selects or activates wordlines of said data-storing array, said sample wordline, when activated, propagating a voltage alone said sample wordline with a delay, said delay being used to time enablement of a sense amplifier which latches the state of a data signal appearing on a bitline connected to an accessed cell of said memory.

2. The delay monitor circuit of claim 1 wherein said sample wordline is activated by a wordline driver circuit having substantially the same structure or location as wordline driver circuits which activate wordlines in said data-storing array.

3. The delay monitor circuit of claim 1 wherein said sample wordline is selected by a row decoder circuit having substantially the same structure or location as row decoder circuits which activate wordlines in said data-storing array.

4. The delay monitor circuit of claim 1 wherein said sample wordline is located along a peripheral edge of said data-storing array.

5. The delay monitor circuit of claim 4 wherein said sample wordline is comprised of a pair of dummy wordlines of said data-storing array which are joined together at a location at or past the midpoint.

6. The delay monitor circuit of claim 1 wherein activation of said sample wordline is detected on a side of said data-storing array which lies opposite a side where said circuitry is located which selects or activates said sample wordline.

7. The delay monitor circuit of claim 1 further comprising a sample wordline redundancy which is selected or activated by said circuitry which selects or activates said sample wordline.

8. The delay monitor circuit of claim 7 wherein said circuitry comprises a decoder circuit coupled to receive nonvolatile input and a wordline driver circuit coupled to activate either of said sample wordline or said sample wordline redundancy based on output from said decoder circuit.

9. The delay monitor circuit of claim 1 wherein said data-storing array is a first of a plurality of data-storing arrays, at least two sample wordlines are located within said first data-storing array, and said sample wordlines are activated alternately during successive accesses to a second data storing array of said memory.

10. The delay monitor circuit of claim 9 wherein said sample wordlines in said first data-storing array are activated alternately during successive accesses to a second data-storing array within a bank which includes said first and said second data-storing arrays.

11. A wordline activation delay monitor circuit for a semiconductor memory, comprising:
at least one first sample wordline located within a data-storing subarray of a first subarray group which includes at least one subarray of a memory bank;
at least one second sample wordline located within a data-storing subarray of a second subarray group which includes at least one subarray of said memory bank;
a sample wordline driver circuit coupled to activate said first sample wordline when a data location within said second subarray group is to be accessed and to activate said second sample wordline when a data location within said first subarray group is to be accessed, said first sample wordline, when activated, propagating a voltage along said first sample wordline with a first delay, said first delay being used to time enablement of a sense amplifier which latches the state of a data signal appearing on a bitline connected to an accessed memory cell within said second subarray group, and said second sample wordline, when activated, propagating a voltage along said second sample wordline with a second delay, said second delay being used to time enablement of a sense amplifier which latches the state of a data signal appearing on a bitline connected to an accessed memory cell within said first subarray ground.

12. The delay monitor circuit of claim 11 wherein activation of said sample wordline is detected on a side of said data-storing array which lies opposite a side where said sample wordline driver circuit is located.

13. A method of determining a wordline activation delay in a semiconductor memory, comprising the steps of:

activating a sample wordline located in a data-storing array which includes memory cells accessible through wordlines and bitlines using at least one of a row decoder circuit or wordline driver circuit which has substantially the same structure as that used to activate wordlines within said data-storing array;

estimating said activation delay from a delay in propagation of an activation voltage along said sample wordline; and using said activation delay, timing activation of a sense amplifier which latches the state of a data signal appearing on a bitline connected to an accessed cell of said memory.

14. The method of claim 13 wherein said row decoder circuit or wordline driver circuit is physically located within an area of said memory which is allocated to row decoder circuits or wordline driver circuits, respectively, for said data-storing array.

15. The method of claim 14 wherein both said row decoder circuit and said wordline driver circuit have substantially the same structure as row decoder circuits and wordline driver circuits, respectively, which activate wordlines of said data-storing array.

16. The method of claim 15 wherein both said row decoder circuit and said wordline driver circuit are physically located within an area of said memory which is allocated to row decoder circuits and to wordline driver circuits, respectively, for said data-storing array.

17. The method of claim 13 wherein activation of said sample wordline is detected on a side of said data-storing array which lies opposite a side where said row decoder circuit or said wordline driver circuit used to activate said sample wordline is located.

18. A method of determining a wordline activation delay in a semiconductor memory comprising the steps of:

providing a memory bank having a plurality of data-storing subarrays each including memory cells accessible through wordlines and bitlines, said subarrays arranged in first and second groups each having at least one subarray;

providing a sample wordline within a data-storing subarray of each of said first and second groups;

at a time when a data location of a subarray within said first group is to be accessed, changing a wordline voltage at an input location of said sample wordline in a subarray of said second group to activate said sample wordline; and determining an activation delay from a detected voltage at a second location of said first sample wordline; and using said activation delay, timing activation of a sense amplifier which latches the state of a data signal appearing on a bitline connected to said data location.

19. The delay monitor circuit of claim 1 wherein said sample wordline activation delay is representative of a delay in activating a wordline of said memory.

* * * * *